US010855305B2

(12) United States Patent
Eitan et al.

(10) Patent No.: US 10,855,305 B2
(45) Date of Patent: Dec. 1, 2020

(54) HIGH-SPEED, LOW POWER, LOW KICKBACK NOISE COMPARATOR SUITABLE FOR A MULTI-COMPARATOR SUCCESSIVE APPROXIMATION ANALOG-TO-DIGITAL CONVERTER (ADC)

(71) Applicant: Intel Corporation, Santa Clara, CA (US)

(72) Inventors: Roee Eitan, Jerusalem (IL); Ahmad B. Khairi, Hillsboro, OR (US); Yosi Sanhedrai, Jerusalem (IL); Ram Livne, Ramat Raziel (IL); Ilya Kraimer, Haifa (IL); Hen Sallem, Pardesiya (IL); Idan Lotan, Bitzaron (IL); Ariel Cohen, Modiin-Makkabbim-Reut (IL); Dror Lazar, Kiryat Bialik (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/375,572

(22) Filed: Apr. 4, 2019

(65) Prior Publication Data
US 2019/0238150 A1 Aug. 1, 2019

(51) Int. Cl.
*H03M 1/38* (2006.01)
*G06F 13/40* (2006.01)
(Continued)

(52) U.S. Cl.
CPC .......... *H03M 1/38* (2013.01); *G06F 13/1668* (2013.01); *G06F 13/4022* (2013.01);
(Continued)

(58) Field of Classification Search
CPC ........ H03M 1/38; H03M 1/1215; H03M 1/46; H03M 1/08
(Continued)

(56) References Cited

U.S. PATENT DOCUMENTS

| 6,593,865 B2* | 7/2003 | Nestler | H03M 3/474 |
| | | | 341/141 |
| 10,340,938 B1 | 7/2019 | Eitan et al. | |
| 2016/0065230 A1* | 3/2016 | Mulder | H03M 1/1014 |
| | | | 341/158 |

OTHER PUBLICATIONS

Razavi, Behzad, "The Strong Arm Latch", IEEE Solid-State Circuits Magazine, Digital Object Identifier 10.1109/MSSC.2015.2418155, Jun. 25, 2015, 6 pages.
(Continued)

*Primary Examiner* — Peguy Jean Pierre
(74) *Attorney, Agent, or Firm* — Compass IP Law PC

(57) ABSTRACT

A comparator is described. The comparator includes a differential pair having first and second transistors to respectively receive first and second input signals. The comparator also includes a current sink or source transistor coupled to respective source nodes of the first and second transistors. The current sink or source transistor is coupled to receive a fixed bias to keep the current sink transistor active so that large voltage changes on the source nodes is avoided. The comparator circuit includes a latch circuit coupled to respective drain nodes of the first and second transistors. The latch circuit is to reach a final state to present the comparator's output signal. The comparator includes a first switch circuit coupled between the first transistor's drain node and the latch circuit, and a second switch circuit coupled between the second transistor's drain node and the latch circuit. The first and second switch circuits to allow the first and second transistors' respective drain node voltage and source node voltage to enter and exit the comparator's comparison state at a same voltage.

20 Claims, 8 Drawing Sheets

(51) Int. Cl.
　　　*G06F 13/16*　　(2006.01)
　　　*H03K 5/24*　　(2006.01)
　　　*H03M 1/12*　　(2006.01)
　　　*H03M 1/46*　　(2006.01)
　　　*H03M 1/08*　　(2006.01)

(52) U.S. Cl.
　　　CPC ........ *H03K 5/2481* (2013.01); *H03M 1/1215* (2013.01); *H03M 1/46* (2013.01); *H03M 1/08* (2013.01)

(58) Field of Classification Search
　　　USPC .................. 341/143, 122, 155, 120, 118, 161
　　　See application file for complete search history.

(56) References Cited

OTHER PUBLICATIONS

L. Kull et al., "28.5 A 10b 1.5GS/s Pipelined-SAR ADC With Background Second-Stage Common-Mode Regulation and Offset Calibration in 14nmCMOS FinFET," 2017 IEEE International Solid-State Circuits Conference (ISSCC), San Francisco, CA, 2017, pp. 474-475.

L. Kull, et al., "A 3.1mW 8b 1.2GS/s Single-Channel Asynchronous SAR ADC with Alternate Comparators for Enhanced Speed in 32nm Digital SOICMOS," ISSCC, submitted Feb, 2013, Published IEEE Journal of Solid-State circuits, vol. 48, No. 12, pp. 3049-3058, Dec. 2013.

\* cited by examiner

HIGH-SPEED, LOW POWER, LOW KICKBACK NOISE COMPARATOR SUITABLE FOR A MULTI-COMPARATOR SUCCESSIVE APPROXIMATION ANALOG-TO-DIGITAL CONVERTER (ADC)

FIELD OF INVENTION

The field of invention pertains generally to the electric arts, and, more specifically, to a high-speed, low power, low kickback noise comparator suitable for a multi-comparator successive approximation analog to digital converter (ADC).

BACKGROUND

As computing systems and the networks they communicate over continue to increase in speed, designers of analog to digital converter (ADC) circuits are continually seeking ways to make the circuits they design more precise, higher speed and/or lower power.

FIGURES

A better understanding of the present invention can be obtained from the following detailed description in conjunction with the following drawings, in which.

Figure 1:
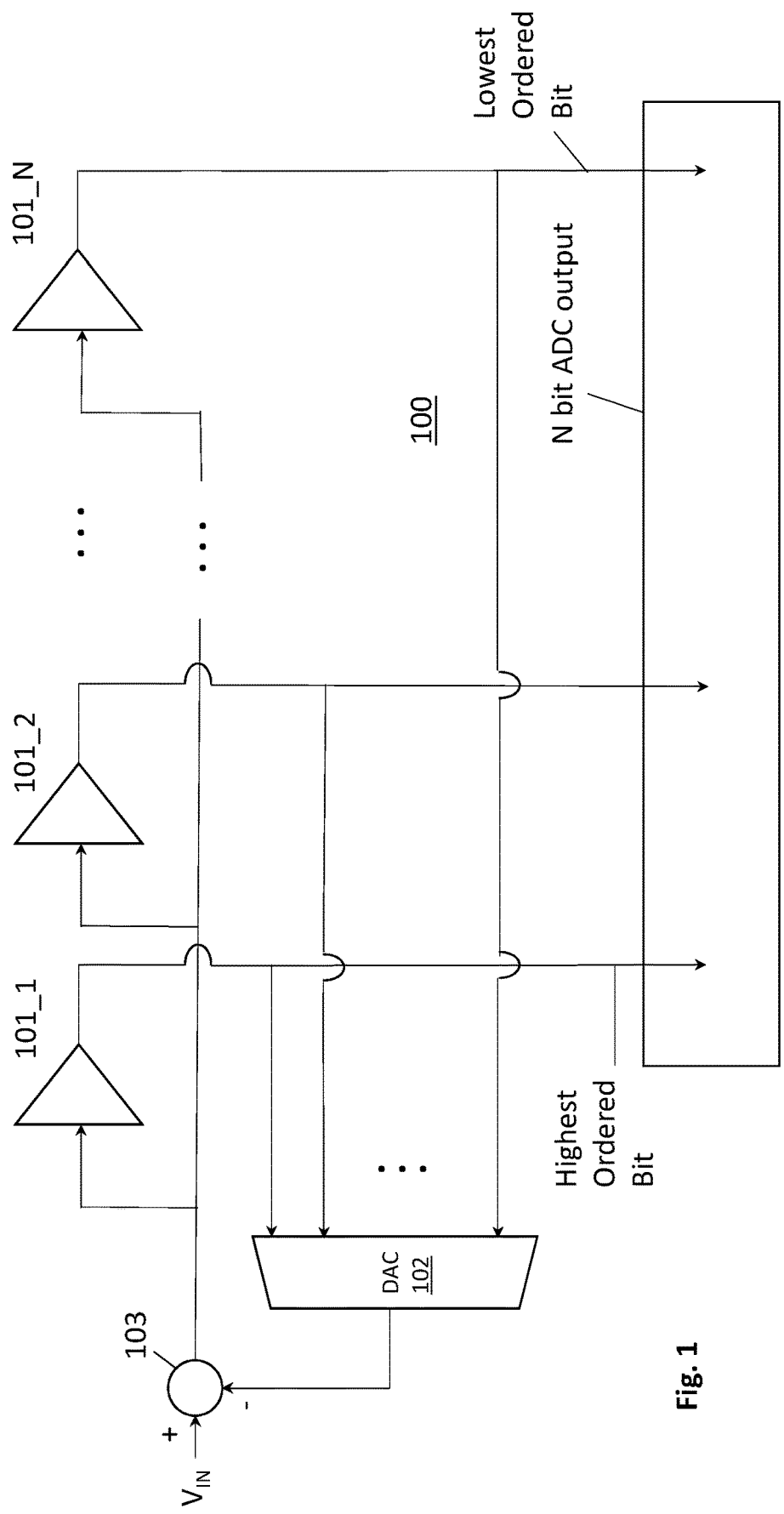
FIG. 1 shows a comparator chain analog-to-digital-converter (ADC)

DETAILED DESCRIPTION i. Multi-Comparator Successive Approximation ADC

A successive approximation register (SAR) analog-to-digital-converter (ADC) provides a digital value that represents an analog input voltage, where, successive comparisons are made, and, with each next comparison in the sequence of comparisons the digital output value becomes more precise.

For example, the result of a first comparison establishes whether the SAR input voltage is above or below half of a fixed reference. The result of a second, following comparison establishes whether the SAR input voltage is above or below 75% of the fixed reference if the result of the first comparison established that the SAR input voltage was above half the fixed reference, or, establishes whether the SAR input voltage is above or below 25% of the fixed reference if the result of the first comparison established that the SAR input voltage was below half the fixed reference. With each following (successive) comparison, the comparison establishes whether the SAR input voltage is above or below the midpoint voltage between the ever-narrowing voltage range that the input voltage is deemed to be within. The more comparisons that are performed the more precise/granular the ADC. Depending on implementation, the input voltage(s) to the ADC's comparator(s) and/or their respective reference voltage(s) can be adjusted with each comparison.

According to a possible SAR ADC architecture, only one comparator is instantiated. The comparator's output decision (which identifies whether the input voltage is above or below its comparison threshold) is written to memory or register space. For a next comparison, the comparator is reset, the previous output is read from the memory/register space and used to adjust the comparator's next input signal value. The process repeats until the number of performed comparisons corresponds to the desired accuracy. A problem with the single comparison approach is the delay time waiting for the comparator to reset with each iteration, and, the power consumption and delay associated with reading/writing from/to the register/memory with each iteration (the reset and clocking also contributes to additional power consumption).

A dual comparator SAR ADC architecture improves upon the single comparator architecture's reset delay problem. In the case of a dual comparator architecture a second following comparator operates from the output of a first, preceding comparator (the input signal value of the second comparator is adjusted based on the first comparator's decision). The second comparator performs its comparison while the first comparator is resetting and writes its output to memory/register space. While the second comparator is resetting, the output from the second comparator is read from the memory/register space and used to adjust the input signal value of the comparison of the first comparator which performs the next comparison. The process repeats until the number of performed comparisons corresponds to the desired accuracy. A challenge with the dual comparator approach is the power consumption of and delay associated with reading/writing from/to the register/memory with each iteration.

A multi-comparator successive approximation ADC architecture 100, depicted in FIG. 1, improves further upon the dual comparator. According to a full multi-comparator version, a separate comparator circuit 101_1 through 101_N is instantiated for each of N comparisons to be made in the successive approximation process. The comparators 101_1 through 101_N are logically coupled in series such that an immediately following comparator operates in response to its immediately preceding comparator having generated its respective output.

The ADC's accuracy improves as comparisons ripple through the comparator chain (e.g., the first comparator 101_1 determines the most significant bit of the ADC output, the second comparator 101_2 determines the second most significant bit of the ADC output, etc., . . . the output of the last comparator 101_N determines the least significant bit of the ADC output). Other architectures may fit somewhere between the dual comparator architecture and the full multi-comparator architecture (e.g., the number of comparators is equal to half the number of comparisons to be performed requiring only one write to and read from memory/register per analog-to-digital conversion). A more detailed explanation of the operation of the multi-comparator successive approximation ADC architecture is provided further below.

Figure 2:
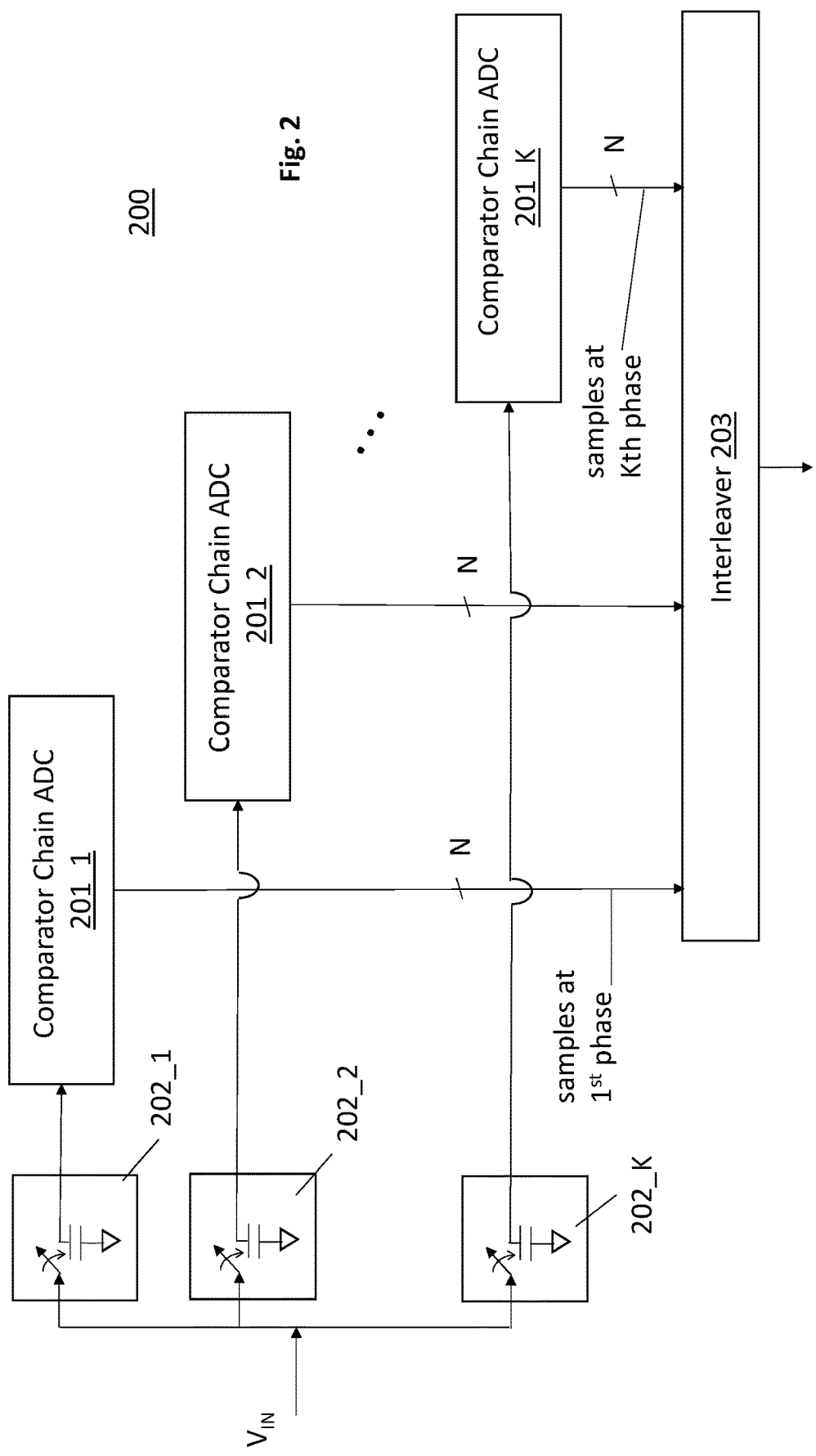
FIG. 2 shows a high performance ADC that includes multiple parallel comparator chain ADCs.

FIG. 2 shows a successive approximation ADC architecture 200 that includes multiple, parallel comparator chain ADCs 201_1 through 201_M. Here, each comparator chain ADC 201 corresponds, e.g., to the ADC design 100 of FIG. 1. Each ADC comparator chain 201 is preceded by its own respective sampling circuit 202 that generates samples of the input signal. The frequency at which samples are taken is the same across all the sampling circuits 202, however, there exists a phase offset between their respective sampling activity. As such, each ADC comparator chain 201 operates on a sample stream having same sample rate as compared to other sample streams but represents a different phase position(s) of the input signal. The digital output samples from the parallel ADC chains are then time multiplexed together by an interleaver circuit 203 to form a single, digital output stream.

The overall ADC of FIG. 2 can have a large number of comparators (the total number of comparators in the ADC of FIG. 2 is NK). As such, the lower the power consumption per comparator, the less overall power consumption of the ADC. Additionally, the faster the ADC's comparators, the higher the ADC's maximum input signal frequency. Finally, as the accuracy/precision of the comparators respective comparisons improves, the more closely the ADC's digital output stream will represent the analog input signal waveform.

A traditional candidate for the comparator to be used in the ADC of FIG. 2 has been the "strong-arm" comparator.

ii. Strong Arm Comparator

Figure 3:
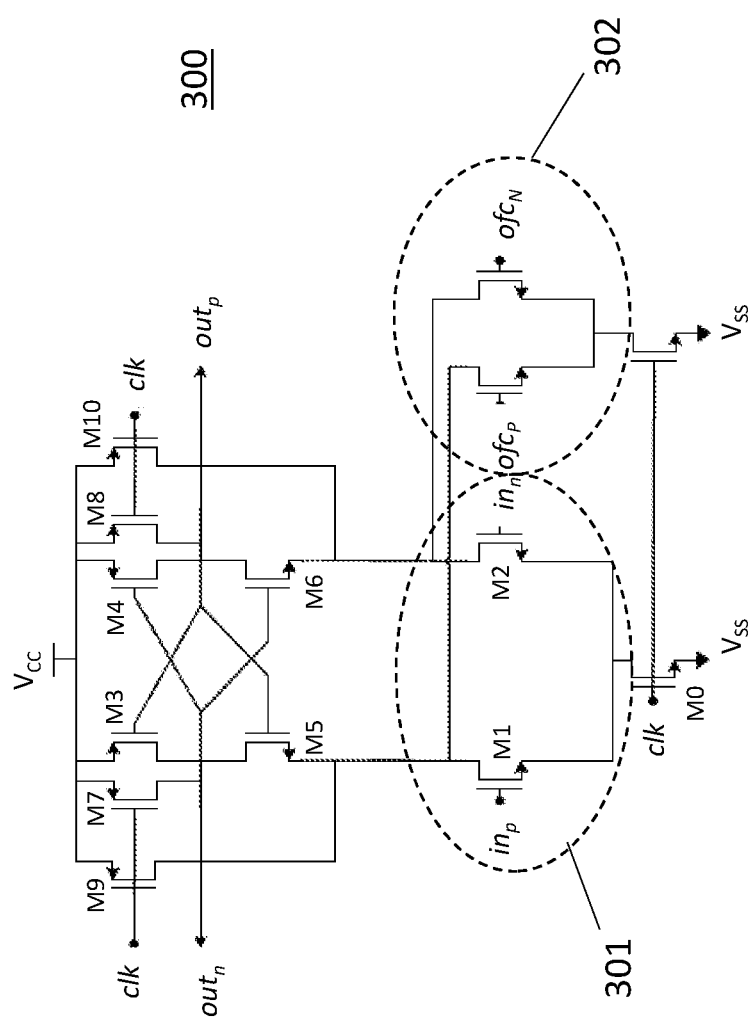
FIG. 3 (prior art) shows a strong arm differential comparator.

A traditional strong arm comparator 300 is depicted in FIG. 3. As observed in FIG. 3 the comparator 300 includes a first input differential pair 301 that receives a + input signal ($in_p$) at the gate of M1 and a − input signal ($in_n$) at the gate of M2 (a second input differential pair 302 is used to reduce/eliminate any offsets that exist in the comparator circuit). The comparator's differential output is provided at output nodes outp, outn and indicates which of the input signals is greater.

Figure 4:
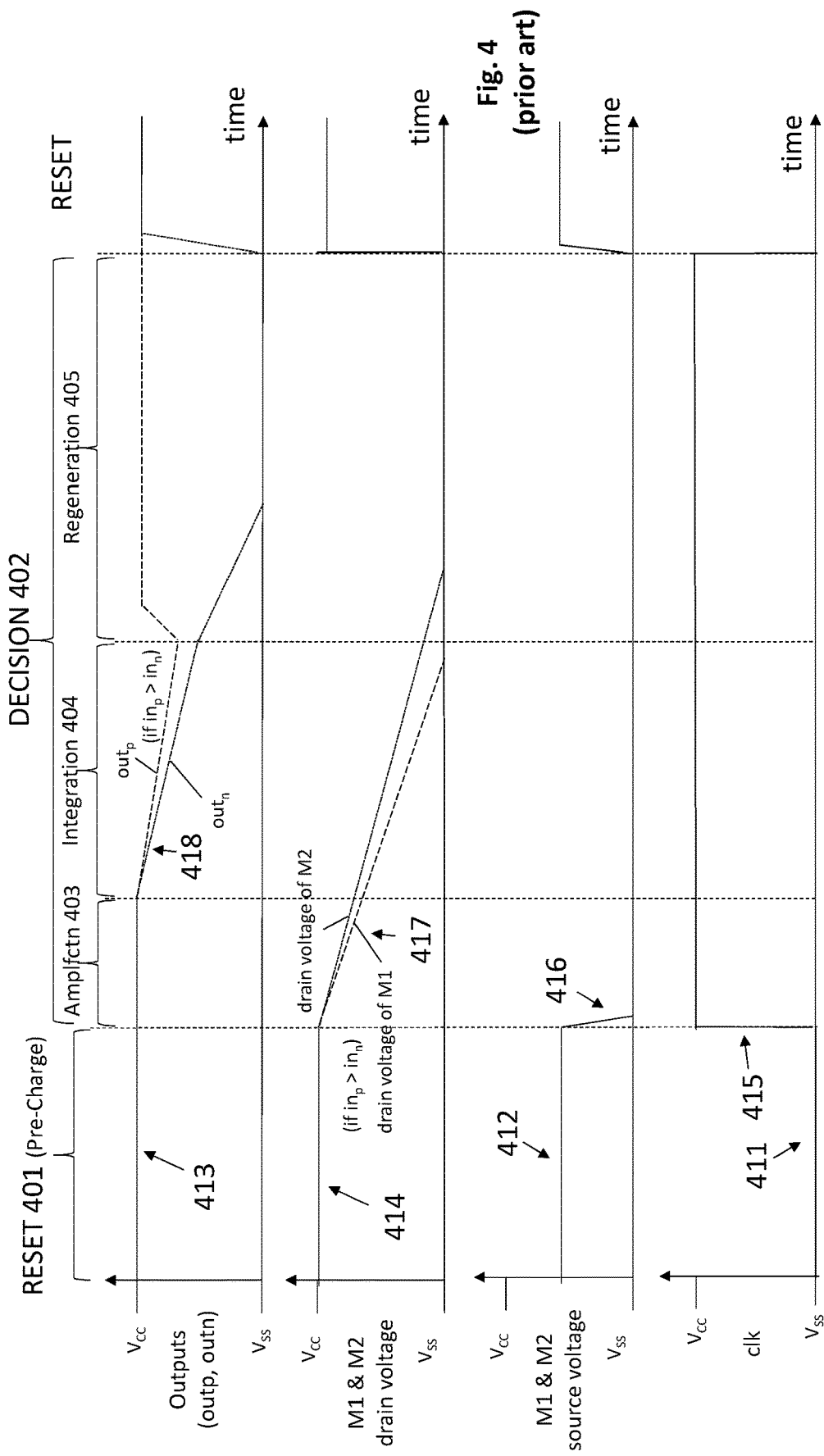
FIG. 4 (prior art) shows pertinent voltage waveforms of the strong arm comparator of FIG. 3.

FIG. 4 shows transient voltage behavior of the output nodes outp, outn, the drain and source nodes of M1 and M2 and the input clock signal over the course of the comparator's operation.

Referring to FIG. 4, initially, the clock (clk) input signal is low 411 which keeps the comparator in a reset state 401. In the reset (or "pre-charge") state 401, because the clk input is low, transistor M0 is OFF and transistors M7 through M10 are ON. The former (M0 OFF) essentially disables transistors M1 and M2 so that a comparison of the input signal components cannot be made (both M1 and M2 are OFF because neither transistor conducts current). As a consequence, the source nodes of M1 and M2 equal the midpoint (common mode) voltage between $in_n$ and $in_p$ less the transistor threshold voltage $V_T$ 412. The later (M7 through M10 ON) causes both output nodes $out_p$, $out_n$ and the drain nodes of both M1 and M2 to be clamped to $V_{CC}$ 413, 414.

When the clk input signal transitions to a logic high 415, a "decision state" is entered 402. The decision state has three distinct phases: amplification 403, integration 404, and regeneration 405. Each of these are described immediately below.

In the amplification phase 403, with clk=HI, M0 is turned ON and the source node voltages of M1 and M2 transition 416 to $V_{SS}$. Both M1 and M2 turn ON and conduct current that flows through M0 where one of M1 and M2 pulls more current than the other in proportion to the difference between $in_n$ and $in_p$ (differential pair 301 is enabled to make a comparison of the $in_n$ and $in_p$ input nodes). Additionally, M7 through M10 are turned OFF which "unclamps" the voltages on outp, outn and the drain nodes of M1 and M2.

At the onset of the decision state's amplification phase 403, M3 through M6 are initially OFF. The respective current pull of M1 and M2 is therefore initially sourced from the capacitance of the respective drain nodes of M1 and M2. Assuming $in_p > in_n$, M1 will pull more current than M2 which, in turn, causes the drain voltage of M1 to fall more rapidly 417 than the drain voltage of M2. Eventually the respective drain voltage M1 is pulled down to $V_{CC}-V_{T\_M5}$ which causes M5 to turn ON and allows the current through M1 to be additionally sourced from the capacitance of the $out_n$ node. Sometime later the respective drain voltage of M2 is pulled down to $V_{CC}-V_{T\_M6}$, M6 turns ON and the current through M2 is additionally sourced from the capacitance of the $out_p$ node. The turning ON of transistors M5 and M6 corresponds to entry into the integration phase 404.

During the integration phase 404 the sourcing of the M1 and M2 current from the capacitance of the $out_p$ and $out_n$ nodes causes the $out_p$ and $out_n$ voltages to drop 418. Eventually outp and outn voltage drops to $V_{CC}-V_T$ and M3 and M4 turn ON. When both M3 and M4 have turned ON, the comparator enters the regeneration phase 405 (the drain voltages of M1 and M2 continue to drop over the course of the integration phase 404 as M1 and M2 continue to pull current).

In the regeneration phase 405, M1 is allowed to pull current from $V_{CC}$ through the M3/M5 current leg and M2 is allowed to pull current from $V_{CC}$ through the M4/M6 current leg. With M1 continually pulling more current than M2, eventually, outn will fall below $V_{SS}+V_T$. As, such M6 will pinch off and M4 will remain active which sets $out_p$ to $V_{cc}$. With $out_p$ at $V_{CC}$, M3 will pinch off and M5 will be active which permits $out_n$ to be pulled down to approximately $V_{SS}$.

Here, M3 through M6 effectively correspond to an output latch of inverter-like circuits coupled together in a feedback arrangement (the output of the M4/M6 inverter is coupled to the input of the M3/M5 inverter and the output of the M3/M5 inverter is coupled to the input of the M4/M6 inverter). At the conclusion of the decision state 402 the drain nodes and source nodes of M1 and M2 are equal to $V_{SS}$ because M0 is ON and neither of M1 and M2 conduct current.

A correspondingly opposite sequence of events than those just described with respect to FIG. 4 will occur if $in_p < in_n$.

Kickback noise, however, is a problem if the strong arm comparator is implemented in the multi-comparator successive approximation ADC of FIG. 1 (and likewise will be a problem if integrated into the interleaved successive approximation ADC of FIG. 2). Kickback noise is input noise caused by voltage changes on the M1/M2 source nodes and/or the M1/M2 drain nodes between entrance and exit of the reset state 401 and/or entrance and exit of the comparison state 402. Here, referring to FIG. 4, note that the strong arm comparator exhibits voltage changes on M1/M2 drain and source nodes between both entrance/exit of the reset state 401 and entrance/exit of the comparison state 402.

Specifically, in the reset state 401 the M1/M2 drain nodes start at $V_{SS}$ and end at $V_{CC}$, and, in the comparison state 402 the M1/M2 drain nodes start at $V_{CC}$ and end at $V_{SS}$. Likewise, in the reset state 401 the M1/M2 source nodes start at $V_{SS}$ and end at the $in_p/in_n$ midpoint (less $V_T$) voltage, and, in the comparison state 402 the M1/M2 source nodes start at the $in_p/in_n$ midpoint (less $V_T$) voltage and end at $V_{SS}$.

Here, owing to the voltage differences on the M1/M2 drain nodes between entrance and exit of the reset and comparison states 401, 402, noise voltages can couple from the M1/M2 drain nodes to the $in_p/in_n$ input nodes through the M1/M2 gate-to-drain capacitance (CGD). Likewise, owing to the voltage differences on the M1/M2 source nodes between entrance and exit of the reset and comparison states 401, 402, noise voltages can couple from the M1/M2 source nodes to the $in_p/in_n$ input nodes through the M1/M2 gate-to-source capacitance (CGS).

The common mode noise can be particularly troublesome for the comparator chain ADC of FIG. 1. Here, referring back to FIG. 1, according to one embodiment, the analog input signal $V_{IN}$ is a differential signal and correspondingly the output of the difference unit 103 is a differential signal. Each comparator in the comparator chain determines whether its input signal is greater than or less than 0. That is, a comparator input signal is greater than 0 if $in_p > in_n$, or, a comparator input signal is less than 0 if $in_p < in_n$. The difference unit 103 subtracts or adds a combination of specific voltage amounts (provided by digital-to-analog converter 102) from/to the analog input signal $V_{IN}$ based on the status of previous comparisons made within the comparator chain 101.

For example, according to one embodiment, if the input to the first comparator 101_1 is >0, the output of the first comparator 101_1 (which corresponds to the most significant bit of the ADC output) is 1, or, if the input to the first comparator 101_1 is <0, the output of the first comparator is 0. If the output of the first comparator 101_1 is 1, the DAC 102 subtracts one half the reference voltage (Vref/2) from the input signal $V_{IN}$. By contrast, if the output of the first comparator 101_1 is 0, the DAC 102 adds Vref/2 to the input signal $V_{IN}$.

After the adjustment by the DAC 102, the second comparator 101_2 (which corresponds to the second most significant bit of the ADC output) determines if the adjusted signal from the difference unit 103 is greater than 0 or less than 0. If the second comparator 101_2 determines that the adjusted signal from the difference unit 103 is greater than 0, the output of the second comparator is 1. If the second comparator 101_2 determines that the adjusted signal from the difference unit 103 is less than 0, the output of the second comparator is 0. If the output of the second comparator 101_2 is 1, the DAC 102 subtracts Vref/4 from the input signal $V_{IN}$. By contrast, if the output of the second comparator 101_2 is 0, the DAC 102 adds Vref/4 to the input signal $V_{IN}$. The process then continues in this fashion, with adjustments made by the difference unit 103 decreasing by powers of 2, until the last comparator 101_N in the chain (which corresponds to the least significant bit in the ADC output) performs its comparison.

Here, the common mode kickback noise described above can not only affect the precision of an individual comparator, but also, accumulates with each comparison made through the comparator chain. Specifically, such accumulation creates a common mode drift that pushes comparator and DAC operating ranges outside feasible values. In order to eliminate the drift, after each comparison in the comparator chain, a comparator reset is performed and the DAC's control state is saved. Performing a comparator reset and saving the DAC's control state after each comparison diminishes ADC performance and increases ADC power consumption.

iii. Improved Comparator

Figure 5:
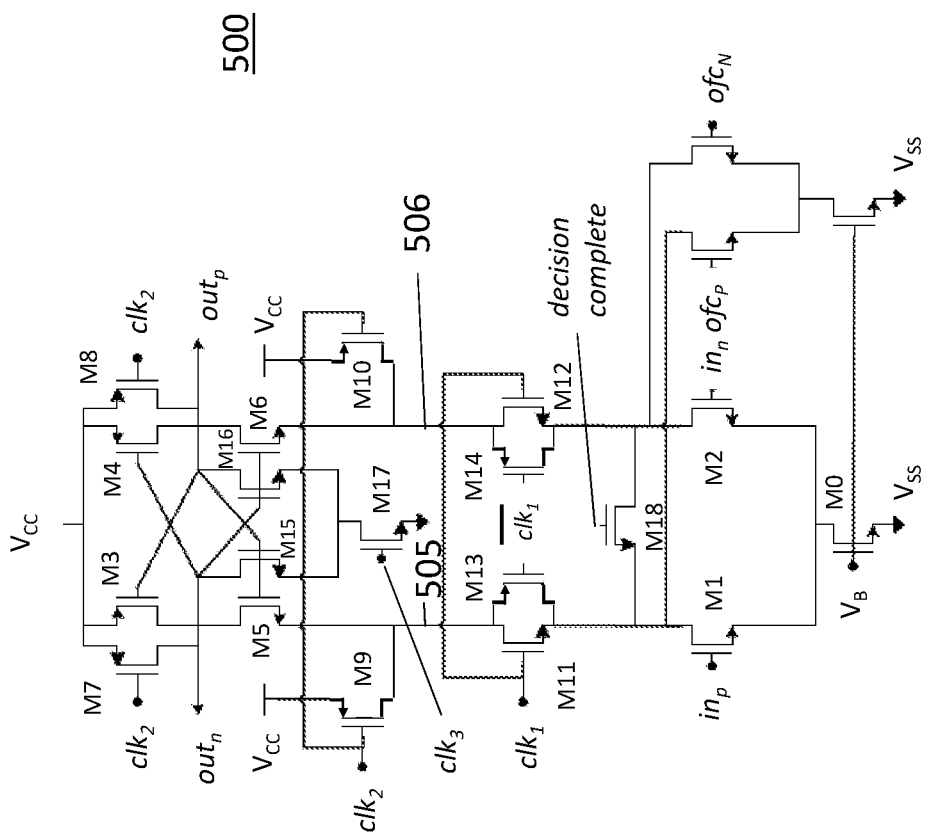
FIG. 5 shows an improved differential comparator.

FIG. 5 shows an improved comparator circuit 500 that is designed to induce substantially less common mode kickback noise as compared to the strong arm comparator of FIG. 3. The comparator 500 of FIG. 5 can also exhibit reduced differential kickback noise and reduced power consumption without loss of performance. Voltage waveforms of pertinent nodes of the comparator 500 of FIG. 5 are provided in FIG. 6.

The comparator circuit 500 of FIG. 5 provides a constant gate bias to the current source transistor M0 of the M1/M2 input differential pair which keeps the M0 transistor actively biased. As described in more detail further below, keeping M0 actively biased prevents large M1/M2 source node voltage changes from entrance to exit for both the reset and comparison states 601, 602. Additionally, the comparator circuit 500 introduces a fourth, preceding phase (the predeterminant phase 606) to ramp the M1/M2 drain nodes from $V_{SS}$ toward $V_{CC}$ at the beginning of the comparison state 602.

By so doing, the M1/M2 drain nodes, like the M1/M2 source nodes, enter and exit both the reset and comparison states 601, 602 at the same voltage ($V_{SS}$). Because the M1/M2 source and drain nodes enter and exit both the reset and comparison states 601, 602 at $V_{SS}$, kickback noise is substantially reduced as compared to the strong arm comparator 300 of FIG. 3.

Figure 6:
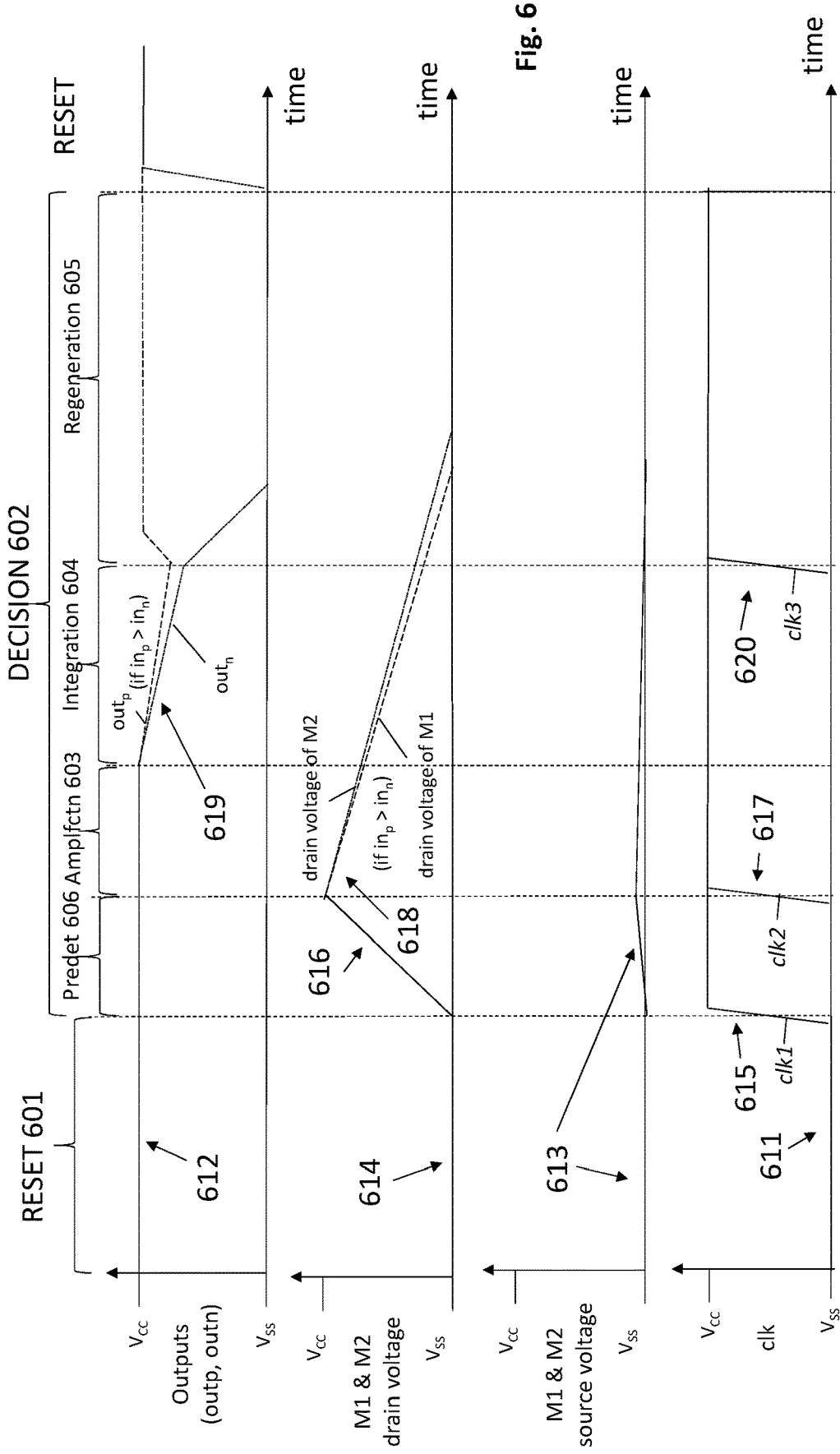
FIG. 6 shows pertinent voltage waveforms of the improved comparator of FIG. 5.

With reduced kickback noise (and particularly with reduced common mode kickback noise), integration of the improved comparator 600 of FIG. 6 into the multi-comparator ADC 100 of FIG. 1 permits operation of the ADC 100 without having to save the DAC's 102 control state after each comparison. As such, the ADC 100 should observe improved performance and power consumption as the inefficient per-comparison comparator reset and corresponding per-comparison DAC control state store that is necessitated by the strong arm comparator is avoided. Moreover, as explained further below, the comparator can be made power efficient yet operate with sufficient speed. The improved comparator 600 is therefore an improved solution for a high performance multi comparator chain ADC (such as the high performance ADC observed in FIG. 2) over a traditional strong arm comparator.

As observed in FIG. 6, in an initial reset state 601, all clock signals (clk1, clk2 and clk3) are LO 611. As such, M7 through M10 are ON which clamps the output nodes outp, outn 612 and internal nodes 505, 506 to $V_{CC}$. With the output nodes outp, outn and internal nodes 505, 506 clamped to $V_{CC}$ both M5 and M6 are OFF (M3 and M4 are also OFF).

Additionally, switch circuits composed of transistors M11 through M14 are OFF which decouples the M1/M2 drain nodes from internal nodes 505, 506 and prevents M1 and M2 from conducting current (M11 and M13 form a first switch, M12 and M14 form a second switch). Both M1 and M2 cannot conduct current because M11 through M14 are OFF. Current sink transistor M0, however, is actively biased (its gate is not coupled to a clock input, but rather, a fixed bias voltage $V_B$). With M0 actively biased, M1 and M2 OFF and the M1/M2 drains decoupled from internal nodes 505, 506, both the M1/M2 source and drain nodes are clamped 613, 614 to $V_{SS}$. In the reset state, although M0 is actively biased, it does not conduct current because M1 and M2 cannot conductor current.

The onset of the comparison state 602 begins with clk 1 rising 615 to HI. As alluded to above, the comparison state 602 of the improved comparator 600 includes a preceding predeterminant phase 606 to ramp 616 the drain nodes of M1/M2 from $V_{SS}$ toward $V_{CC}$. Here, with switch circuits M11 through M14 having been OFF during reset 601, the M1/M2 drain nodes remained at $V_{SS}$ during reset 601 so as to minimize kickback noise. With the comparison state 602 having commenced with the positive clk1 edge 615, the M1/M2 drain nodes need to be ramped up 616 so that M1 and M2 enter saturation mode and can begin comparing $in_p$ and $in_n$.

Here, the rising clk1 edge 615 turns the switch circuits M11 through M14 ON so as to couple the M1/M2 nodes to internal nodes 505, 506. The coupling of the M1/M2 drain nodes to internal nodes 505, 506 (which remain clamped to $V_{CC}$ because clk2 remains LO) therefore causes the M1/M2 drain nodes to ramp up 616 from $V_{SS}$ toward $V_{CC}$ and place M1 and M2 in saturation mode. M5 and M6 remain OFF after the rising clk1 edge 615. The charge that ramps up the M1/M2 drain node voltages is sourced from VCC through M9 and M10. Such charge is stored in capacitances associated with the M1/M2 drain nodes (and any parallel capacitances associated with the M11 through M14 switches and M18).

Notably, over the course of the transition from the reset 601 to the comparison states 602, the M1/M2 source nodes remain clamped substantially at/near $V_{SS}$ (the source nodes may initially rise toward $((vinp+vinn)/2)-V_{GS\_M1\_M2}$ and then decay back to $V_{SS}$). As such, M0 prevents large voltage changes on the M1/M2 source nodes. In various embodiments, the actively biased M0 transistor also improves common mode rejection, limits comparator power by limiting current through the differential pair 601, provides better resilience to physical mismatches between the M1 and M2 transistors (minimizes random offsets) and/or allows the circuit to achieve ideal (or near ideal) bias of M1,M2 to optimize power/speed/noise tradeoffs.

As such, as with the M1/M2 drain nodes, exit from the reset and entrance to the comparison states 601, 602 is characterized by the M1/M2 source and drain nodes holding their respective voltages substantially at/near $V_{SS}$.

After sufficient time to ramp the M1/M2 drain nodes toward $V_{CC}$, the second clock (clk2) transitions 617 to HI which causes transistors M7 through M10 to turn OFF. With transistors M7 through M10 OFF, the outn, outp nodes and internal nodes 504, 505 are no longer clamped to $V_{CC}$.

At this point, the circuit has reached a state that is comparable, but not identical, to the beginning of the amplification phase 403 of the strong arm comparator. In particular, whereas the strong arm comparator begins the amplification phase with the sources of both M5 and M6 at the same voltage ($V_{CC}$), by contrast, a small differential voltage develops across the M5 and M6 source nodes during the predeterminant phase of the improved comparator (i.e., they are not identical but nearly so). Going forward, the comparator 600 behaves like the strong arm 403, 404 over the amplification 603 and integration phases 604 (given the initial difference between the source node voltages of M5 and M6). Here, if $in_p > in_n$, M1 will pull more current than M2. The M1/M2 drain voltages drop 618 in response. Eventually M5 and M6 turn ON signifying the beginning of the integration phase 604.

The currents pulled by M1 and M2 are sourced by M1/M2 drain capacitance (and any parallel capacitances associated with M11 through M14 and/or M18) until M5 and M6 turn ON. After M5 and M6 turn ON, M3 and M4 remain OFF. As such, over the course of the integration phase 604, M1 and M2 continue to pull respective currents that are additionally sourced by capacitance associated with the output nodes outn, outp. The pulling of current from capacitance associated with outn, outp causes the voltages on the outn, outp nodes to drop in response 619.

Eventually the outp and outn voltages drop to $V_{CC}-V_T$ and M3 and M4 turn ON. After both M3 and M4 have turned ON the comparator enters the regeneration phase 605 (the output latch drives the output signal). In the regeneration phase 605, outn will fall below $V_{SS}+V_T$, M6 will pinch off and M4 will remain active which sets $out_p$ to $V_{cc}$. With $out_p$ at $V_{CC}$, M3 will pinch off and M5 will be active which permits out to be pulled down to approximately $V_{SS}$ by M1.

The comparator embodiment 600 of FIG. 6 also includes a "parallel tail" circuit composed of transistors M15 through M17 that is integrated into the M3 through M6 output latch. From reset 601 through the integration phase 604 each of transistors M15 through M17 cannot conduct current because sink transistor M17 is OFF. However, clk3 is configured to transition 620 to a logic HI approximately when a sufficient difference develops across the outp and outn outputs which turns sink transistor M17 ON and enables the parallel tail circuit (e.g., after the initial decision should be apparent across the outp and outn nodes, the parallel tail circuit is enabled to quickly drive the output to its final state). The parallel tail circuit, when enabled, provides additional pull-down strength to cause whichever of the outp, outn outputs being pulled down to $V_{SS}$ (outn when $in_p > in_n$) is pulled down to $V_{SS}$ faster than it otherwise would be if the parallel tail circuit were not present.

At the end of the regeneration phase 605, transistor M18 is enabled to short the M1/M2 drain nodes. Here, whichever of the M1 and M2 drains is being pulled down to $V_{SS}$ more slowly (the drain of M2 in the present example) may not ultimately reach $V_{SS}$ by the time the end of the regeneration phase 605 is reached. Activation of M18 causes the particular drain to be pulled down to $V_{SS}$ by the time the regeneration phase 605 is complete. Thus, at the end of the regeneration phase 605 (end of comparison state 602), the M1/M2 drain voltages are both ideally at $V_{SS}$. Transistor M18 therefore helps minimize differential kickback noise (the difference between the M1 drain and M2 drains are made the same at the end of comparison 602, through reset 601 until the start of the next comparison).

The comparison state 602 ends at the end of the regeneration phase 605, all three clocks transition 620 to HI and the next reset state is entered. Looking back at overall operation from the first reset 601, note that the M1/M2 source and drain nodes will enter and exit both the reset 601 and comparison 602 states at the same voltage ($V_{SS}$), which, in turn reduces kickback noise.

Apart from reduced kickback noise, the comparator 600 can also operate as a low power comparator. Here, the presence of the parallel tail circuit M15 through M17 permits the comparator to operate sufficiently fast at a reduced $V_{CC}$ voltage (which corresponds to sufficiently high speed and low power consumption). As a consequence, the comparator 600 $V_{CC}$ may be set to a voltage that is less than the supply voltage of other analog circuits that exist on the same semiconductor chip as the comparator (e.g., the comparator's $V_{CC}$ is the same $V_{CC}$ as logic circuits that are integrated on the same semiconductor chip as the comparator).

It is pertinent to recognize that the improved comparator circuit 600 of FIG. 6 can also be implemented with the N type and P type transistors and overall being opposite to that depicted in FIG. 5 (e.g., M0 becomes a P type current source (rather than an N type current sink, etc.). It is also pertinent to recognize that the usage of three clocks as described at length above is just one embodiment as there can be other embodiments that operate the clocks differently. For example, if noise is not a particular concern (e.g., the ADC's precision is less of a concern), clk1 and clk2 may be consolidated into the same clock signal (so that M9 and M10 turn OFF on the same edge that M11 through M14 turn ON). Contra-wise, if propagation delay (speed) is less of a concern, clk3 and/or the parallel tail circuit M15 through M17 can be eliminated.

vi. Applications of Improved Comparator

As discussed at length above, the improved comparator is suitable for integration into a multi-comparator ADC such as the multi-comparator ADC 100 of FIG. 1. Because of the reduced kickback noise, a multi-comparator ADC 100 constructed with the improved comparator need not perform a comparator reset with each comparison performed in the comparator chain nor save/load to/from memory or register space DAC control state with each comparison performed in the comparison chain.

Multiple multi-comparator ADCs each constructed from a chain of improved comparators may be integrated into a high performance ADC such as the high performance ADC of FIG. 2. As discussed at length above, the high performance ADC of FIG. 2, when constructed from multiple instances of multi-comparator ADCs having the improved comparator should exhibit high performance (improved speed without per comparison resets) and low power (elimination of per comparison DAC control state load/store, reduced comparator $V_{CC}$ with parallel tail).

Although the improved comparator has been described in relation to a multi-comparator ADC, it should be pointed out that the various improvements of the above described improved comparator could nevertheless be utilized in other applications such as a single or dual comparator ADC, or, any other circuit having a comparator.

The various ADCs described above may be particularly useful at the front receiving end of a high speed communication interface such as a high speed Ethernet interface (e.g., a 100 Gb/s IEEE 802.3ck interface). Such high speed interfaces are commonly found in networking systems such as switches and/or routers and computing systems (e.g., servers, desktop computers, etc.).

Figure 7:
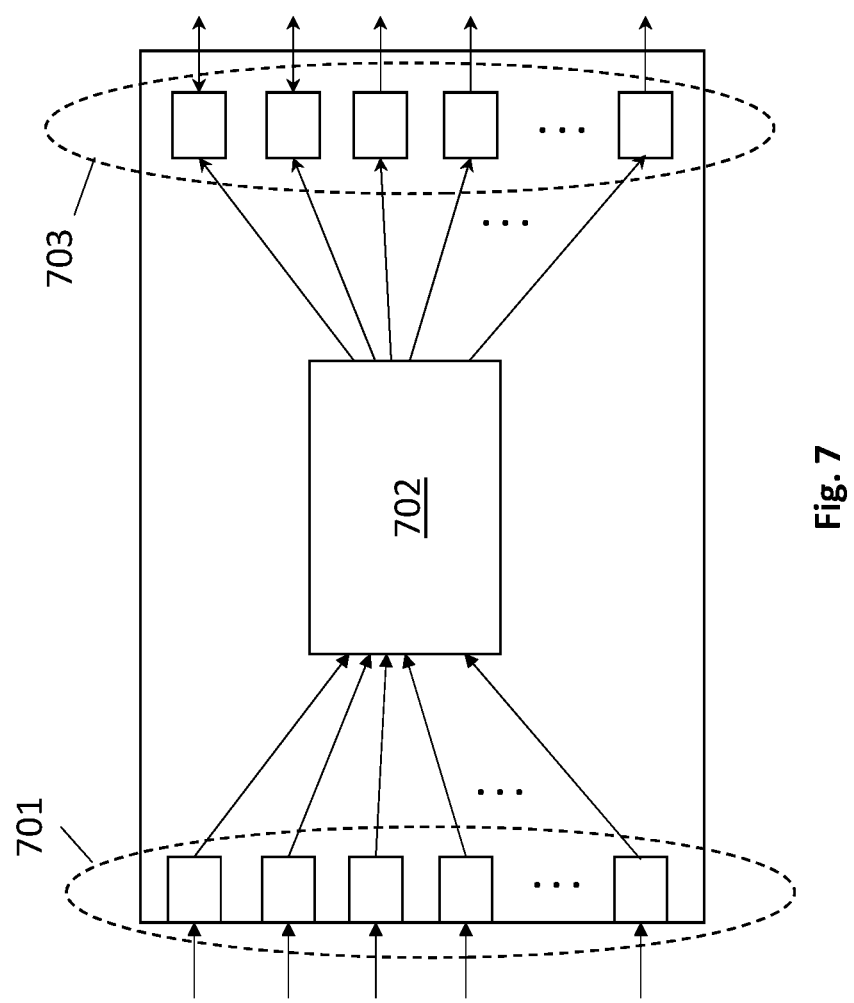
FIG. 7 shows a networking system.

FIG. 7 shows a networking system 700. As observed in FIG. 7 the networking system includes a number of ingress ports 701 that receive packets of information from one or more networks and feed the ingress packets into a routing or switch core 702. The routing or switch core 702 determines the appropriate one or more output ports that each packet should be emitted from and directs each such packet towards its appropriate one or more output ports. The various ADC approaches described above may integrated at the front end of any/all of the input ports 701.

Figure 8:
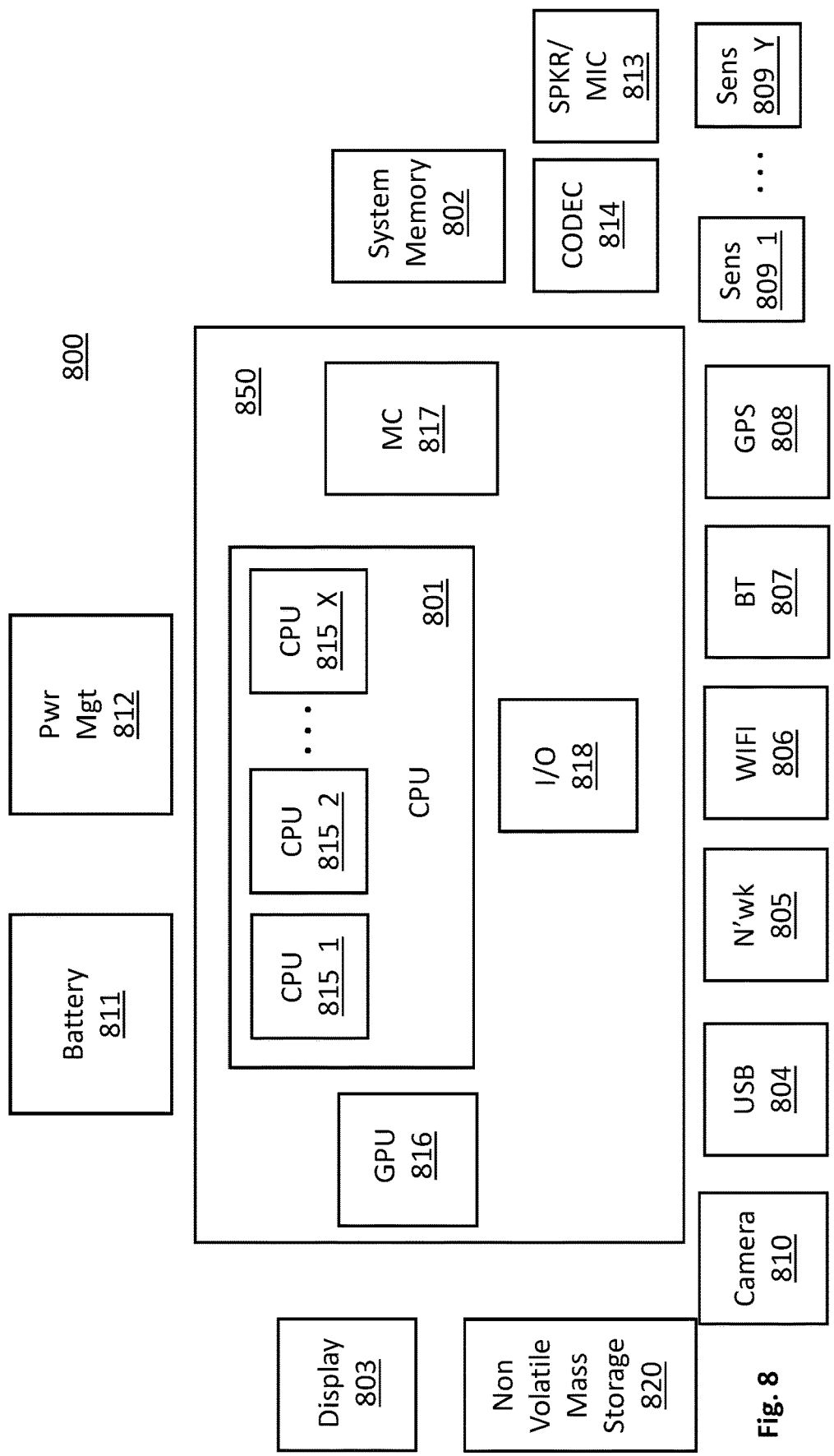
FIG. 8 shows a computing system.

FIG. 8 provides an exemplary depiction of a computing system 800 (e.g., a smartphone, a tablet computer, a laptop computer, a desktop computer, a server computer, etc.). As observed in FIG. 8, the basic computing system 800 may include a central processing unit 801 (which may include, e.g., a plurality of general purpose processing cores 815_1 through 815_X) and a main memory controller 817 disposed on a multi-core processor or applications processor, system memory 802, a display 803 (e.g., touchscreen, flat-panel), a local wired point-to-point link (e.g., USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_Y, one or more cameras 810, a battery 811, a power management control unit 812, a speaker and microphone 813 and an audio coder/decoder 814.

An applications processor or multi-core processor 850 may include one or more general purpose processing cores 815 within its CPU 801, one or more graphical processing units 816, a memory management function 817 (e.g., a memory controller) and an I/O control function 818. The general purpose processing cores 815 typically execute the operating system and application software of the computing system. The graphics processing unit 816 typically executes graphics intensive functions to, e.g., generate graphics information that is presented on the display 803. The memory control function 817 interfaces with the system memory 802 to write/read data to/from system memory 802. The power management control unit 812 generally controls the power consumption of the system 800.

Each of the touchscreen display 803, the communication interfaces 804-807, the GPS interface 808, the sensors 809, the camera(s) 810, and the speaker/microphone codec 813, 814 all can be viewed as various forms of I/O (input and/or output) relative to the overall computing system including, where appropriate, an integrated peripheral device as well (e.g., the one or more cameras 810). Depending on implementation, various ones of these I/O components may be integrated on the applications processor/multi-core processor 850 or may be located off the die or outside the package of the applications processor/multi-core processor 850. The computing system also includes non-volatile storage 820 which may be the mass storage component of the system.

Any analog-to-digital conversion performed by the computing system, including but not limited to analog-to-digital conversion performed at the front end of a network interface may incorporate the teachings provided at length above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components. For example an HDL, RTL or transistor level netlist description of the above described comparator and/or ADC may be used to perform a simulation of an electronic circuit in a computer environment.

Therefore elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An analog-to-digital-converter (ADC) apparatus for data center applications, comprising:
  a successive approximation register (SAR) analog-to-digital-converter (ADC) to provide a digital value that represents an analog input voltage, and to make successive comparisons to improve accuracy of the digital value, the SAR ADC comprising a comparator, the comparator comprising an input differential pair and circuitry to keep the input differential pair's respective source and drain nodes at a same voltage when the comparator is entering and exiting a comparison state thereby reducing kickback noise.

2. The ADC apparatus of claim 1 wherein the comparator comprises a tail circuit to pull current through a latch circuit in parallel with a current sink or source of the input differential pair.

3. The ADC apparatus of claim 1 wherein an upper supply voltage rail of the comparator is set to a voltage that is less than a supply voltage rail of another analog circuit on a same semiconductor die as the comparator.

4. The ADC apparatus of claim 1 wherein the SAR ADC is positioned at a front receiving end of a network interface.

5. The ADC apparatus of claim 4 wherein the network interface is an Ethernet interface.

6. The ADC apparatus of claim 1 wherein the SAR ADC is integrated within any of:
a network switch system;
a network router system.

7. The ADC apparatus of claim 1 wherein a current sink or source of the input differential pair is to receive a fixed bias so that large voltage changes on respective source nodes of the input differential pair is avoided.

8. The ADC apparatus of claim 1 wherein the comparator comprises a tail circuit coupled to a latch circuit to pull current through the latch circuit in parallel with a current sink or source of the input differential pair.

9. A comparator, comprising:
an input differential pair and circuitry to keep the input differential pair's respective source and drain nodes at a same voltage when the comparator is entering and exiting a comparison state thereby reducing kickback noise.

10. The comparator of claim 9 wherein the comparator comprises a tail circuit to pull current through a latch circuit in parallel with a current sink or source of the input differential pair.

11. The comparator of claim 10 wherein an upper supply voltage rail of the comparator is set to a voltage that is less than a supply voltage rail of another analog circuit on a same semiconductor die as the comparator.

12. The comparator of claim 9 wherein the comparator is integrated into a SAR ADC, wherein, the SAR ADC is positioned at a front receiving end of a network interface.

13. The comparator of claim 12 wherein the network interface is an Ethernet interface.

14. The comparator of claim 9 wherein the comparator is integrated within any of:
a network switch system;
a network router system.

15. The comparator of claim 9 wherein a current sink or source of the input differential pair is to receive a fixed bias so that large voltage changes on respective source nodes of the input differential pair is avoided.

16. The comparator of claim 9 wherein the comparator comprises a tail circuit coupled to a latch circuit to pull current through the latch circuit in parallel with the current sink or source of the input differential pair.

17. A computing system, comprising:
a plurality of processing cores;
a system memory;
a system memory controller between the plurality of processing cores and the system memory;
a network interface comprising an ADC SAR, the ADC SAR comprising a comparator, the comparator comprising an input differential pair and circuitry to keep the input differential pair's respective source and drain nodes at a same voltage when the comparator is entering and exiting a comparison state thereby reducing kickback noise.

18. The computing system of claim 17 wherein the comparator comprises a tail circuit to pull current through a latch circuit in parallel with a current sink or source of the input differential pair.

19. The computing system of claim 18 wherein an upper supply voltage rail of the comparator is set to a voltage that is less than a supply voltage rail of another analog circuit on a same semiconductor die as the comparator.

20. The computing system of claim 17 wherein a current sink or source of the input differential pair is to receive a fixed bias so that large voltage changes on respective source nodes of the input differential pair is avoided.

* * * * *